United States Patent

Sakai et al.

(10) Patent No.: US 11,948,794 B2
(45) Date of Patent: Apr. 2, 2024

(54) METHOD OF MANUFACTURING SILICON CARBIDE EPITAXIAL WAFER

(71) Applicant: Mitsubishi Electric Corporation, Tokyo (JP)

(72) Inventors: Masashi Sakai, Tokyo (JP); Takuma Mizobe, Fukuoka (JP); Takuyo Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 312 days.

(21) Appl. No.: 17/241,903

(22) Filed: Apr. 27, 2021

(65) Prior Publication Data
US 2022/0028688 A1 Jan. 27, 2022

(30) Foreign Application Priority Data

Jul. 21, 2020 (JP) ................................ 2020-124320

(51) Int. Cl.
*H01L 21/02* (2006.01)
*C23C 16/02* (2006.01)
(Continued)

(52) U.S. Cl.
CPC .... *H01L 21/02529* (2013.01); *C23C 16/0236* (2013.01); *C23C 16/325* (2013.01);
(Continued)

(58) Field of Classification Search
CPC . C23C 16/0236; C23C 16/325; C30B 25/186; C30B 25/20; C30B 29/36;
(Continued)

(56) References Cited

U.S. PATENT DOCUMENTS 9,957,641 B2 * 5/2018 Nishiguchi ....... H01L 21/02378
9,988,738 B2    6/2018 Tomita et al.
(Continued)

FOREIGN PATENT DOCUMENTS

JP    2013-014469 A    1/2013
JP    2013-034007 A    2/2013
(Continued)

OTHER PUBLICATIONS

An Office Action issued by the German Patent and Trade Mark Office dated Jul. 12, 2022, which corresponds to German Patent Application No. 10 2021 113 253.3 and is related to U.S. Appl. No. 17/241,903; with English language translation.
(Continued)

*Primary Examiner* — Jaehwan Oh
(74) *Attorney, Agent, or Firm* — Studebaker & Brackett PC

(57) ABSTRACT

Provided is a method of manufacturing a silicon carbide epitaxial wafer appropriate for suppressing an occurrence of a triangular defect. A method of manufacturing a silicon carbide epitaxial wafer includes: an etching process of etching a surface of a silicon carbide substrate at a first temperature using etching gas including $H_2$; a process of flattening processing of flattening the surface etched in the etching process, at a second temperature using gas including $H_2$ gas, first Si supply gas, and first C supply gas; and an epitaxial layer growth process of performing an epitaxial growth on the surface flattened in the process of flattening processing, at a third temperature using gas including second Si supply gas and second C supply gas, wherein the first temperature $T_1$, the second temperature $T_2$, and the third temperature $T_3$ satisfy $T_1 > T_2 > T_3$.

8 Claims, 4 Drawing Sheets

(51) Int. Cl.
*C23C 16/32* (2006.01)
*C30B 25/18* (2006.01)
*C30B 25/20* (2006.01)
*C30B 29/36* (2006.01)
*H01L 21/3065* (2006.01)

(52) U.S. Cl.
CPC ............ *C30B 25/186* (2013.01); *C30B 25/20* (2013.01); *C30B 29/36* (2013.01); *H01L 21/02378* (2013.01); *H01L 21/02634* (2013.01); *H01L 21/3065* (2013.01)

(58) Field of Classification Search
CPC ......... H01L 21/02378; H01L 21/02529; H01L 21/02634; H01L 21/3065
See application file for complete search history.

(56) References Cited

U.S. PATENT DOCUMENTS

| | | | | |
|---|---|---|---|---|
| 10,096,470 | B2* | 10/2018 | Kawada | C30B 25/165 |
| 10,612,160 | B2* | 4/2020 | Nishiguchi | H01L 21/02378 |
| 10,626,520 | B2* | 4/2020 | Aigo | C30B 25/165 |
| 2007/0015333 | A1* | 1/2007 | Kishimoto | H01L 21/0475 |
| | | | | 257/E21.384 |
| 2012/0280254 | A1* | 11/2012 | Muto | H01L 21/0262 |
| | | | | 257/77 |
| 2013/0126906 | A1 | 5/2013 | Tomita et al. | |
| 2013/0217213 | A1* | 8/2013 | Aigo | C30B 25/02 |
| | | | | 438/478 |
| 2015/0267320 | A1* | 9/2015 | Ohno | H01L 21/02378 |
| | | | | 117/97 |
| 2017/0200605 | A1* | 7/2017 | Kawada | C23C 16/45523 |
| 2017/0233893 | A1 | 8/2017 | Miyasaka et al. | |
| 2017/0283984 | A1* | 10/2017 | Hamano | C30B 29/36 |
| 2017/0345672 | A1 | 11/2017 | Kaneko et al. | |
| 2019/0131388 | A1* | 5/2019 | Watanabe | H01L 21/02579 |
| 2019/0187068 | A1 | 6/2019 | Guo et al. | |

FOREIGN PATENT DOCUMENTS

| | | |
|---|---|---|
| JP | 6012841 B2 | 10/2016 |
| JP | 2018-039714 A | 3/2018 |
| JP | 2019-216166 A | 12/2019 |
| WO | 2016/079984 A1 | 5/2016 |

OTHER PUBLICATIONS

An Office Action; "Decision of Refusal," mailed by the Japanese Patent Office dated Nov. 7, 2023, which corresponds to Japanese Patent Application No. 2020-124320 and is related to U.S. Appl. No. 17/241,903; with English language translation.

An Office Action; "Notice of Reasons for Refusal," mailed by the Japanese Patent Office dated Jun. 20, 2023, which corresponds to Japanese Patent Application No. 2020-124320 and is related to U.S. Appl. No. 17/241,903; with English language translation.

* cited by examiner

F I G. 4
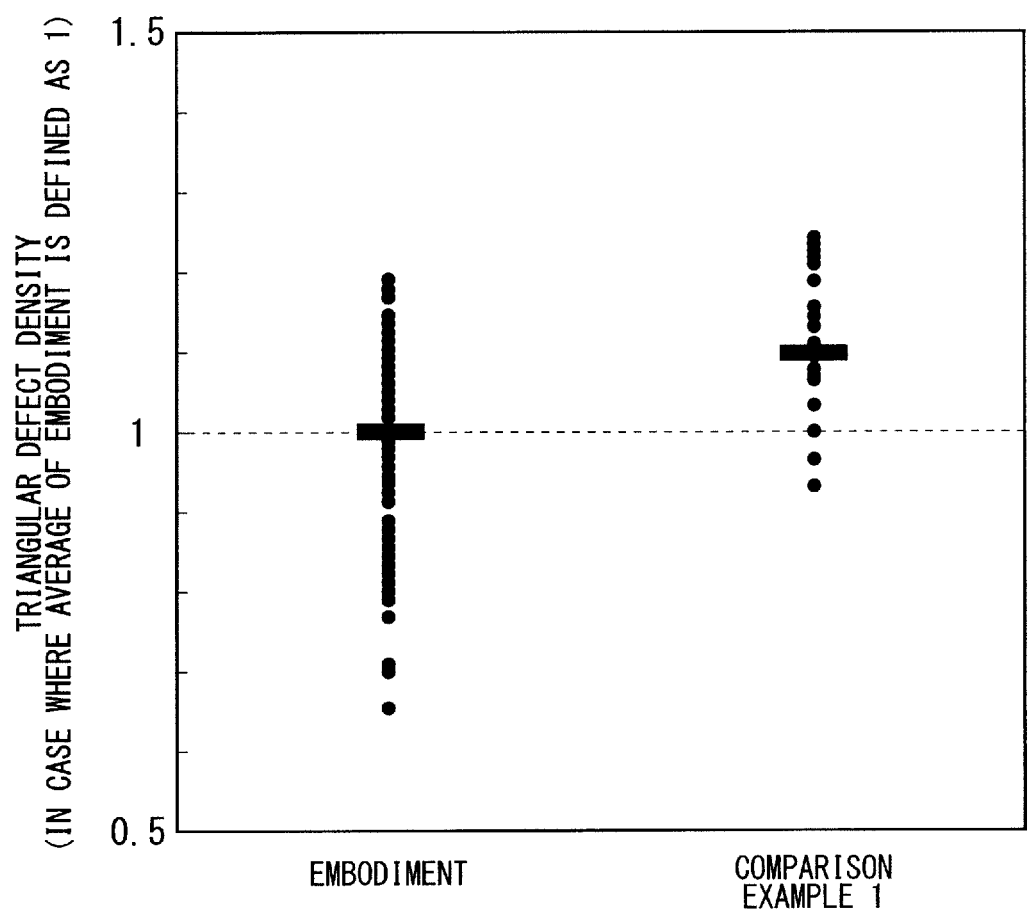

F I G. 5
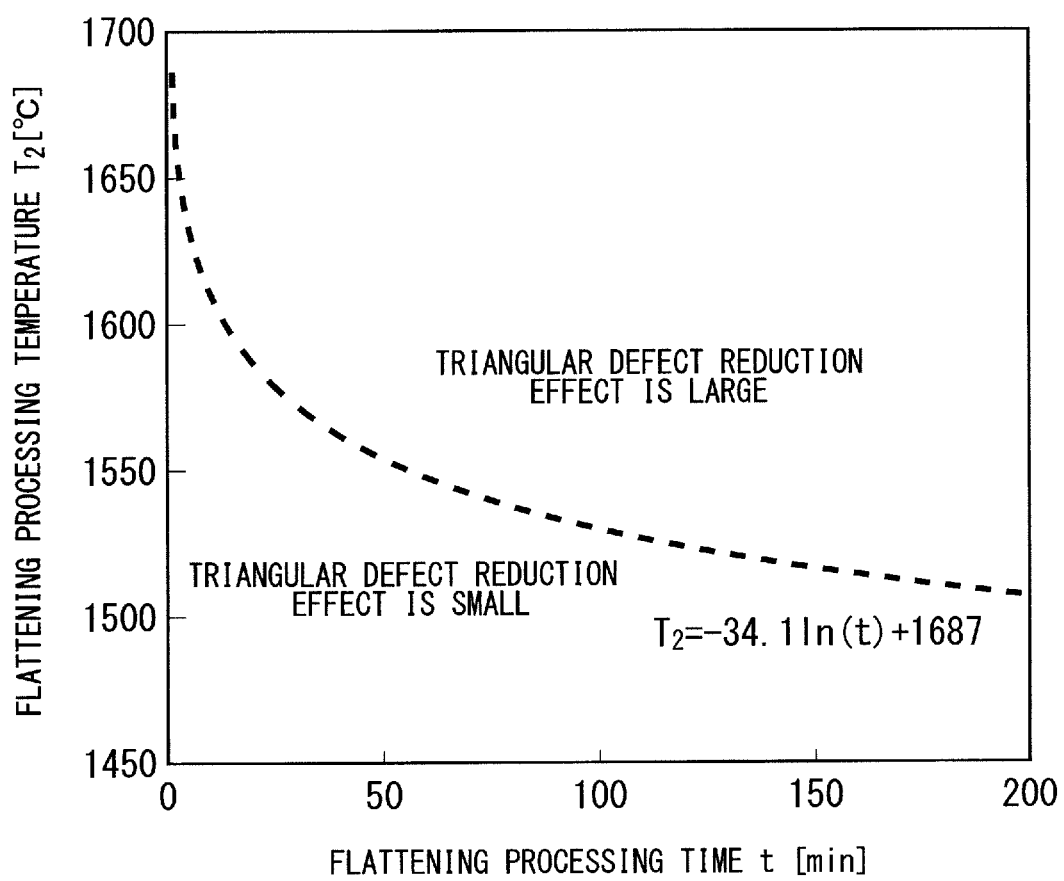

METHOD OF MANUFACTURING SILICON CARBIDE EPITAXIAL WAFER

BACKGROUND OF THE INVENTION

Field of the Invention

The present disclosure relates to a method of manufacturing a silicon carbide epitaxial wafer.

Description of the Background Art

Silicon carbide has a larger bandgap and better physical property values such as an insulation breakdown field intensity, a saturated electron speed, and a thermal conductivity, for example, than silicon, thus has an excellent property as a material of a semiconductor device. Particularly, in a semiconductor device in which silicon carbide is used, a significant reduction of a power loss and downsizing of the semiconductor device can be achieved, thus energy saving at a time of a power conversion of a power source can be achieved. Thus, silicon carbide attracts attention as a semiconductor material for achieving a low carbon society by high performance of an electrical vehicle and high functionality of a solar power system, for example.

In order to manufacture a semiconductor device in which silicon carbide is used, firstly, a film in which an impurity concentration is controlled with high accuracy is epitaxially grown on a silicon carbide substrate by chemical vapor deposition (CVD) method, for example, using a silicon carbide epitaxial growth device. A silicon carbide epitaxial layer can be an N type layer by adding nitrogen to epitaxial growth gas, for example. A wafer in which the silicon carbide epitaxial layer is formed on the silicon carbide substrate is referred to as a silicon carbide epitaxial wafer. A device in which an element region is further formed on the silicon carbide epitaxial wafer or various processes are further performed thereon is referred to as a silicon carbide semiconductor device.

Japanese Patent No. 6012841 discloses a method of manufacturing a silicon carbide semiconductor device. Japanese Patent No. 6012841 describes that an occurrence of a surface defect such as step bunching in a silicon carbide epitaxial layer can be suppressed by a method described in Japanese Patent No. 6012841.

SUMMARY

Examples of a defect occurring in the silicon carbide epitaxial layer include a triangular defect. The surface defect can be suppressed by the method in Japanese Patent No. 6012841, however, the suppression of the occurrence of the triangular defect is not particularly considered.

An object of the present disclosure is to provide a method of manufacturing a silicon carbide epitaxial wafer appropriate for suppressing an occurrence of a triangular defect.

In a method of manufacturing a silicon carbide epitaxial wafer according to the present disclosure, a surface of a silicon carbide substrate is etched at a first temperature, the surface etched by the etching is flattened at a second temperature, and an epitaxial growth is performed at a third temperature on the surface flattened by the flattening. Etching gas including $H_2$ is used in the etching. Gas including $H_2$ gas, first Si supply gas, and first C supply gas is used in the flattening. Gas including second Si supply gas and second C supply gas is used in the epitaxial growth. A first temperature $T_1$, a second temperature $T_2$, and a third temperature $T_3$ satisfy $T_1 > T_2 > T_3$.

The etching is performed at the first temperature $T_1$, the flattening is performed at the second temperature $T_2$, and the epitaxial growth is performed at the third temperature $T_3$ under a condition of $T_1 > T_2 > T_3$, thus the occurrence of a triangular defect is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram illustrating a triangular defect density of each silicon carbide epitaxial wafer manufactured in the embodiment and a comparison example 1.

FIG. 5 is a diagram illustrating an effect of flattening processing in a case of changing a flattening processing time and a flattening processing temperature.

DESCRIPTION OF THE PREFERRED EMBODIMENTS

A. Embodiment

A-1. Configuration of Silicon Carbide Epitaxial Growth Device

Described firstly is a configuration of a silicon carbide epitaxial growth device 100 which is a silicon carbide epitaxial growth device according to the present embodiment.

Figure 1:
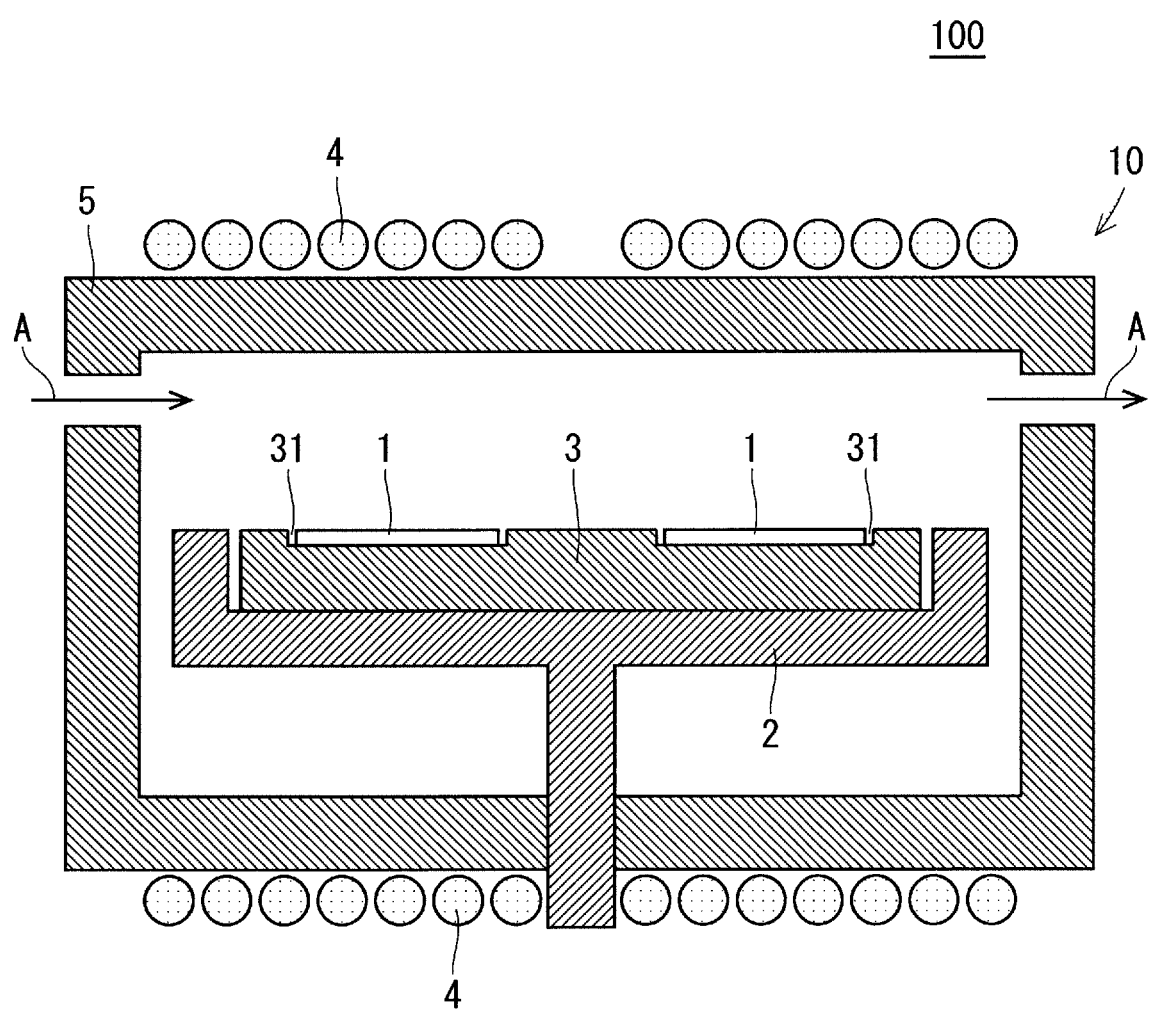
FIG. 1 is a schematic diagram of a silicon carbide epitaxial growth device according to an embodiment.

FIG. 1 is a schematic cross-sectional view of a growth furnace 10 included in the silicon carbide epitaxial growth device according to the embodiment as a main unit thereof. The growth furnace 10 is described hereinafter.

The growth furnace 10 includes a susceptor 5, a wafer holder 3, a rotating table 2, and an induction heating coil 4.

Gas such as growth gas, carrier gas, and etching gas is supplied to and emitted from the susceptor 5 in form of an arrow A illustrated in FIG. 1. Thus, the susceptor 5 is always filled with new growth gas, carrier gas, and etching gas, for example.

When an epitaxial growth layer is formed on a silicon carbide substrate 1, gas including $SiH_4$ as including silicon atoms and $C_3H_8$ gas including carbon atoms is used as the growth gas and gas including $H_2$ is used as the carrier gas, for example. In the silicon carbide epitaxial growth device 100, a growth temperature can be set to range from 1450° C. to 1700° C. and a growth pressure can be set to range from $1 \times 10^3$ Pa to $5 \times 10^4$ Pa, for example. Nitrogen gas for N type doping may be supplied together with the growth gas as necessary. An organic metal material including Al, B, or Be may be supplied for P type doping. Furthermore, HCl or dichlorosilane can be used to increase a growth speed.

The wafer holder 3 has a disk-like shape. A plurality of wafer pockets 31 are formed in a surface of the wafer holder 3 so that the silicon carbide substrate 1 can be disposed therein. The plurality of wafer pockets 31 are formed by performing a spot facing process several times on the surface of the wafer holder 3. The wafer holder 3 is disposed on the rotating table 2, and rotates at a constant speed, for example, together with the rotating table 2 when the epitaxial growth layer is formed on the silicon carbide substrate 1.

The induction heating coil 4 is wound around an outer periphery of the susceptor 5. The wafer holder 3, the susceptor 5, and the rotating table 2 are induction heated when an electrical power is supplied to the induction heating coil 4. When the wafer holder 3, the susceptor 5, and the rotating table 2 are induction heated, the inside of the susceptor 5 is totally heated by thermal conduction and thermal radiation.

In the present embodiment, graphite coated with silicon carbide is used in the wafer holder 3, the rotating table 2, and the susceptor 5. The reason is that the silicon carbide substrate 1 is heated to approximately 1450° C. or more, for example, when the epitaxial growth layer is formed on the silicon carbide substrate 1, thus these elements need to be able to withstand such heat.

Considered herein is a configuration that the wafer holder 3, the rotating table 2, and the susceptor 5 are made up of only graphite. In this case, there is a possibility that graphite causes dust in forming the epitaxial growth layer. If the epitaxial growth layer is formed in a state where microparticles of graphite in the form of dust are located on the silicon carbide substrate 1, crystals are abnormally grown from a position where the microparticles are located, and a crystal defect occurs in the epitaxial growth layer. Thus, it is preferable that graphite is coated with silicon carbide to suppress the dust caused by graphite.

In graphite coated with silicon carbide, the occurrence of the dust caused by graphite is suppressed by the coating of silicon carbide. Diffusion of metal impurity from graphite is also suppressed. The metal impurity causes the crystal defect on the epitaxial growth layer, and also has an influence on electrical characteristics of a semiconductor device, thus it is preferable not to diffuse the metal impurity. Accordingly, graphite coated with silicon carbide is preferably used in the wafer holder 3, the rotating table 2, and the susceptor 5. A silicon carbide material manufactured by CVD method or sintering method may be used for the coating with silicon carbide. Graphite may be coated using tantalum carbide (TaC) in place of silicon carbide. Carbon coating may also be performed on graphite by CVD method.

A-2. Configuration of Silicon Carbide Epitaxial Wafer

Figure 2:
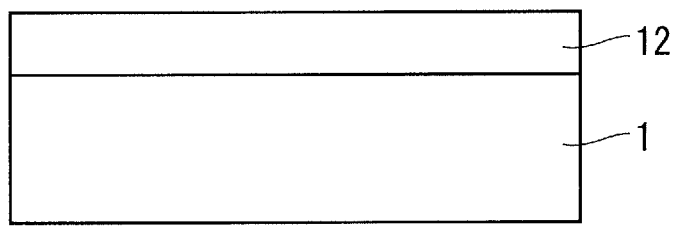
FIG. 2 is a schematic cross-sectional view of a silicon carbide epitaxial wafer.

FIG. 2 is a schematic cross-sectional view of a silicon carbide epitaxial wafer 20 manufactured by a method of manufacturing a silicon carbide epitaxial wafer according to the present embodiment.

The silicon carbide epitaxial wafer 20 manufactured in the present embodiment includes the silicon carbide substrate 1 and a silicon carbide epitaxial layer 12 formed on the silicon carbide substrate 1.

The silicon carbide substrate 1 is an N type silicon carbide substrate having low resistance. A conductivity type of the silicon carbide epitaxial layer 12 is the same as that of the silicon carbide substrate 1, and is specifically N type. The silicon carbide substrate 1 is a silicon carbide substrate 1 having an off-angle inclined with respect to (0001) plane in <11-20> direction at an angle smaller than approximately 5 degrees.

A preferable configuration of the silicon carbide epitaxial wafer 20 is described.

A silicon carbide semiconductor device manufactured by performing various types of processing on the silicon carbide epitaxial wafer 20 is referred to as a silicon carbide semiconductor device 21. If there is a defect in the silicon carbide epitaxial wafer 20 caused by a defect in the silicon carbide substrate 1 and a defect at a time of growth of the silicon carbide epitaxial layer 12, an area where high voltage cannot be held locally occurs in the silicon carbide semiconductor device 21, and leakage current occurs in the silicon carbide semiconductor device 21. When the leakage current occurs in the silicon carbide semiconductor device 21, there is a high possibility that the silicon carbide semiconductor device 21 becomes a defective device, thus if a density of the area where the high voltage cannot be held increases, a non-defective rate in manufacturing the silicon carbide semiconductor device 21 deceases. Typical examples of the defect reducing the non-defective ratio include a lack of a crystallographic uniformity in the silicon carbide epitaxial wafer 20, that is, for example, a defect in which periodicity of an atomic arrangement in crystal is locally imperfect along a crystal growth direction. A carrot defect and a triangular defect occurring by the silicon carbide epitaxial growth are known as some of the defects accompanied with such a lamination defect and causing the leakage current.

Silicon carbide crystal has a plurality of crystal types (polytypes) among which periodicity of an atomic arrangement along a c axis is different, even though they have a stoichiometric proportional composition in which a ratio of Si to C is 1:1, that is the same in ratio, and a crystal lattice with a hexagonal close-packed structure; physical properties are regulated depending on the periodicity. A type referred to as 4H type currently attracts the most attention from a viewpoint of a device application. In order to epitaxially grow the same crystal type, a surface of the silicon carbide substrate is normally set to be a surface inclined with respect to a plane orientation of the crystal, and the silicon carbide substrate is processed to have a surface inclined with respect to (0001) plane in <11-20> direction at an angle of 8 degrees or 4 degrees.

The silicon carbide substrate 1 is processed into a wafer shape by slicing and lapping an ingot of silicon carbide, and subsequently a process damage layer on the surface of the silicon carbide substrate 1 is removed by multistep mechanical polishing, chemical mechanical polishing (CMP), and $H_2$ etching, for example.

If the process damage layer remains on the surface of the silicon carbide substrate 1, a surface defect such as mainly a triangular defect often occurs when the silicon carbide epitaxial layer is formed, and a step-flow growth is also blocked, thus step bunching occurs easily and a roughness on the surface increases. Even if the surface of the silicon carbide substrate 1 is flat in nano-order level, there is a process damage referred to as a latent flaw near the surface of the silicon carbide substrate 1 in some cases. The latent flaw is not basically accompanied with a surface unevenness or extremely small unevenness even if it has, thus the unevenness cannot be confirmed by an optical microscope. However, if there is a latent flaw near the surface of the silicon carbide substrate 1, the latent flaw becomes an origin of the surface defect such as mainly a triangular defect and step bunching in the epitaxial growth.

If a condition of a crystal growth deviates from a desired condition in a manufacturing process of an ingot of silicon carbide, particles referred to as inclusion are taken in the ingot. If the inclusion is located on the surface of the silicon carbide substrate 1, a surface defect such as mainly a triangle defect occurs from the inclusion as an origin in the epitaxial growth, thus the inclusion leads to reduction in a device yield.

As described above, the latent flaw and the inclusion lead to the triangular defect, thus the latent flaw and the inclusion are removed by $H_2$ etching as described hereinafter in the method of manufacturing the silicon carbide epitaxial wafer according to the present embodiment. It is preferable that they are completely removed. If the silicon carbide substrate 1 including the latent flaw or the inclusion is etched by $H_2$ gas, for example, an indent is formed by reason that the etching is promoted in the latent flaw and the inclusion in which a disturbance of a crystal structure occurs, and the indent can be confirmed by an optical microscope. If <A-3-3. Epitaxial layer growth process> described hereinafter is directly performed on the surface having this indent, a triangular defect occurs from the indent as an origin. In the method of manufacturing the silicon carbide epitaxial wafer according to the present embodiment, flattening processing in <A-3-2. Process of flattening processing> described hereinafter is performed to reduce the triangular defect occurring from the indent as the origin, and then an epitaxial layer growth process described in <A-3-3. Epitaxial layer growth process> is performed to form the silicon carbide epitaxial layer 12.

A-3. Method of Manufacturing Silicon Carbide Epitaxial Wafer

A method of manufacturing a silicon carbide epitaxial wafer according to the present embodiment is described.

Figure 3:
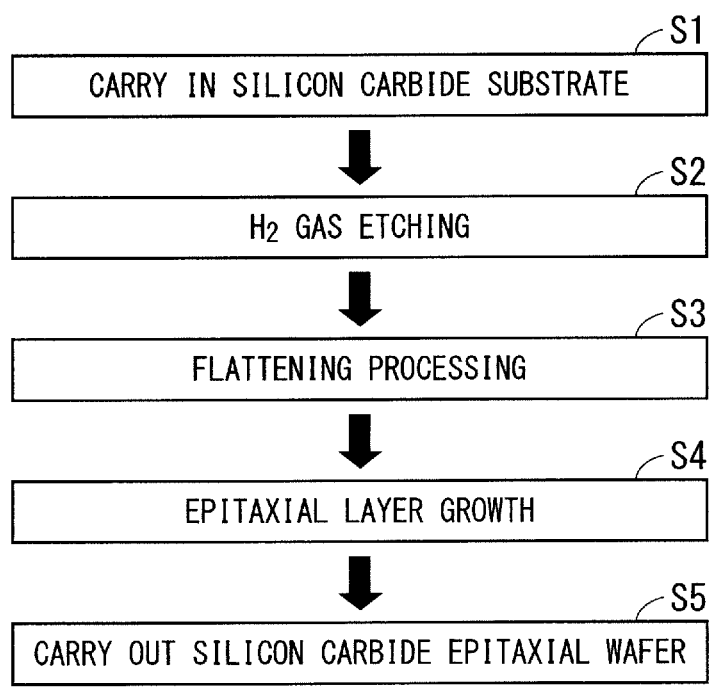
FIG. 3 is a flow chart of a method of manufacturing the silicon carbide epitaxial wafer according the embodiment.

The silicon carbide epitaxial growth device 100 is used in the method of manufacturing the silicon carbide epitaxial wafer according to the present embodiment. FIG. 3 is a flow chart of the method of manufacturing the silicon carbide epitaxial wafer according the present embodiment.

Firstly, the silicon carbide substrate 1 is prepared, and the silicon carbide substrate 1 is disposed in the wafer pocket 31 of the wafer holder 3 outside the susceptor 5. Then, the wafer holder 3 in which the silicon carbide substrate 1 is disposed is disposed on the rotating table 2 provided in the susceptor 5 (a silicon carbide substrate carry-in process, Step S1).

After Step S1, a $H_2$ gas etching process (Step S2), a process of flattening processing (Step S3), and an epitaxial layer growth process (Step S4) are performed in sequence. Subsequently, the silicon carbide epitaxial wafer 20 in which the silicon carbide epitaxial layer 12 is formed on the silicon carbide substrate 1 in the epitaxial layer growth process of Step S4 is transported from the susceptor 5 (a silicon carbide epitaxial wafer carry-out process, Step S5)

The $H_2$ gas etching process (Step S2), the process of flattening processing (Step S3), and the epitaxial layer growth process (Step S4) are individually described in detail hereinafter.

A-3-1. $H_2$ Gas Etching Process

In the $H_2$ gas etching process in Step S2, a pressure in the susceptor 5 is reduced to a desired pressure after Step S1, and then the silicon carbide substrate 1 is heated. The heating is performed by supplying an electrical power to the induction heating coil 4 wound around an outer periphery of the susceptor 5. The susceptor 5, the rotating table 2, and the wafer holder 3 are induction heated when the electrical power is supplied to the induction heating coil 4. The silicon carbide substrate 1 is heated by radiation heat from an inner wall of the susceptor 5 (also by a lateral part of the rotating table 2 when the rotating table 2 has a U-like shape), for example, and conductive heat from the wafer holder 3. When the silicon carbide substrate 1 is heated to a targeted temperature, $H_2$ gas is supplied in the susceptor 5 to perform $H_2$ gas etching.

In the $H_2$ gas etching, gas including $H_2$ gas, that is preferably only $H_2$ gas is flowed in the growth furnace 10, a pressure in the growth furnace 10 is adjusted to be equal to or larger than $5 \times 10^3$ Pa and equal to or smaller than $5 \times 10^4$ Pa, and a temperature of the silicon carbide substrate 1 is set to be equal to or larger than 1650° C. and equal to or smaller than 175° C. In the present embodiment, the $H_2$ gas etching is performed at a pressure of $9 \times 10^3$ Pa and a temperature of 1670° C.

It is preferable that the latent flaw and the inclusion are completely removed to reduce the surface defect such as the triangular defect occurring in the epitaxial growth. When the temperature in the etching is set to be equal to or larger than 1650° C., an etching speed is increased, and a time required to remove the latent flaw and the inclusion is shortened, thus such a temperature is more preferable from a viewpoint of productivity. When the temperature in the etching is set to be equal to or smaller than 1750° C., there is a low frequency that the etching of a silicon carbide product material adhering to a furnace wall of the growth furnace 10 proceeds and particles of silicon carbide drop on the silicon carbide substrate 1.

The latent flaw and the inclusion located on the surface of the silicon carbide substrate 1 are accompanied by a disturbance of a crystal structure and are fragile, thus can be etched by heated $H_2$ gas easily. An indent remains in a position where the latent flaw or the inclusion is located in the surface of the silicon carbide substrate 1 after the etching. A depth of the indent is, for example, approximately equal to or larger than 0.05 μm and equal to or smaller than 0.5 μm, but depends on a size of the latent flaw and the inclusion or an etching condition.

An etching processing time is, for example, equal to or longer than five minutes and equal to or shorter than 30 minutes in a case where a condition of $9 \times 10^3$ Pa and 1670° C. is applied. When the etching time is longer than five minutes, a large latent flaw and inclusion can be removed more efficiently. The etching time is not too long, thus an excessive etching is prevented, and productivity can be increased.

A preferable $H_2$ gas etching condition, particularly, a preferable etching processing time and pressure differs depending on a crystal state and a surface unevenness state of the silicon carbide substrate 1. The $H_2$ gas etching condition is not limited thereto described in the present embodiment as long as the number of latent flaws and inclusions can be reduced to a targeted number.

A-3-2. Process of Flattening Processing

As described above, the latent flaw and the inclusion located in the silicon carbide substrate 1 can be removed by the $H_2$ gas etching process described in <A-3-1. $H_2$ gas etching> or can be preferably eliminated completely. However, the latent flaw and the inclusion can be etched more easily than the other region, thus the indent locally remains in the surface where the latent flaw and the inclusion are located. If the silicon carbide epitaxial layer is formed on the surface which is etched by the $H_2$ gas etching process, thereby having the indent, the abnormal growth occurs from the indent as the origin and leads to the triangular defect in a case where a portion of the indent is not filled but remains in the surface in the epitaxial growth. The occurrence of the triangular defect can be suppressed by performing the epitaxial layer growth process of Step S4 after performing the processing of flattening the indent in the process of flattening processing of Step S3. The process of flattening processing of Step S3 is the same processing condition as the epitaxial layer growth process of Step S4 in the present embodiment except for the processing temperature and the processing time, thus is considered to have a configuration that not only the indent is simply flattened but also the epitaxial growth occurs, and the silicon carbide epitaxial layer 12 also includes the region formed by the process of flattening processing of Step S3. However, the process of flattening processing is performed for a purpose of flattening the indent compared with the epitaxial layer growth process of Step S4 as described hereinafter, thus is referred to as the flattening processing.

The flattening processing of Step S3 is performed under a condition that $H_2$ gas which is carrier gas, $SiH_4$ gas which is Si supply gas, $C_3H_8$ gas which is C supply gas, and $N_2$ gas supplying nitrogen atoms as a dopant, are supplied in the growth furnace 10, a pressure in the growth furnace 10 is adjusted to be equal to or larger than $1\times10^3$ Pa and equal to or smaller than $5\times10^4$ Pa, and the silicon carbide substrate 1 is heated at a temperature equal to or larger than 1550° C. and equal to or smaller than 1680° C. A preferable processing time is, for example, equal to or larger than five minutes and equal to or smaller than 50 minutes. The flattening processing is performed for thirty minutes under a processing condition of $1\times10^4$ Pa and 1600° C.

The processing temperature in the flattening processing of Step S3 is smaller than the processing temperature in the $H_2$ gas etching processing of Step S2, thus an effect of $H_2$ gas etching the indent is suppressed.

When the processing temperature in the flattening processing is increased, energy supplied to atoms of material gas reaching the silicon carbide substrate increases, and a migration of the atoms of the resolved material gas, that is to say, a migration of the resolved material gas on the surface of the silicon carbide substrate 1 is activated. When the migration is activated, the atoms of the material gas also reach the portion of the indent in the surface of the silicon carbide substrate 1 and the effect of flattening the indent is increased, thus the flattening processing can be performed in a shorter time, and productivity is increased. Thus, the processing temperature in the flattening processing of Step S3 is set to be larger than the growth processing temperature in the epitaxial layer growth process of Step S4, and is more preferably set to be equal or larger than 1550° C.

When the temperature is increased, the migration is activated, however, the etching by $H_2$ gas which is the carrier gas is also activated, thus if the temperature is increased too much, the state where the indent is flattened more efficiently by increasing the temperature in the flattening processing does not occur. Thus, the processing temperature in the flattening processing of Step S3 is preferably set to equal to or smaller than 1680° C.

When the epitaxial layer growth process of Step S4 is performed after the process of flattening processing of Step S3, the triangular defect occurring from the indent as the origin can be suppressed compared with the case where the epitaxial layer growth process is performed without the flattening processing (refer to <B. Comparison example 1> and <E. Evaluation result>).

There is a possibility that the preferable flattening processing condition in the process of flattening processing of Step S3 described in the present embodiment differs depending on the condition of $H_2$ gas etching, the crystal state of the silicon carbide substrate 1, or the surface unevenness state, for example, and the flattening processing condition is not limited thereto described in the present embodiment.

A-3-3. Epitaxial Layer Growth Process

Next, the epitaxial layer growth process of Step S4 is performed under the same gas condition as the process of flattening processing of Step S3 except for the processing temperature and the processing time. That is to say, the epitaxial growth is performed on the surface flattened in the process of flattening processing of Step S3 at the same pressure using the same type of gas as those in the process of flattening processing of Step S3 to form the silicon carbide epitaxial layer 12.

The processing temperature in the epitaxial layer growth process of Step S4 is set to be smaller than the processing temperature in the process of flattening processing of Step S3 performed to flatten the indent.

The processing temperature in the epitaxial layer growth process of Step S4 is preferably set to be equal to or larger than 1450° C. and equal to or smaller than 1600° C.

When the processing temperature in the epitaxial layer growth process of Step S4 is reduced, the growth processing of the epitaxial layer is not performed too rapidly, thus the defect and the unevenness remaining after flattening the indent in the silicon carbide substrate 1, for example, are hardly carried over to the surface of the silicon carbide epitaxial layer 12, and the occurrence of the triangular defect caused by the defect and unevenness remaining after the flattening processing can be suppressed easily. Thus, the processing temperature in the epitaxial layer growth process of Step S4 is set to be smaller than the processing temperature in the process of flattening processing of Step S3, and is preferably set to be equal to or smaller than 1600° C. The unevenness remaining after the flattening process is different from the indent occurring in the trace of the latent flaw or the inclusion in the $H_2$ gas etching process, but indicates a widely-formed unevenness such as step bunching.

It is preferable to increase the temperature to increase a thermal decomposition efficiency of the material gas and improve the speed of the epitaxial growth and an in-plane fluctuation of a carrier concentration of the silicon carbide epitaxial layer 12. Thus, the processing temperature in the epitaxial layer growth process of Step S4 is preferably set to be equal to or larger than 1450° C.

In the present embodiment, the epitaxial layer growth process of Step S4 is performed at a temperature of 1500° C. for three hours.

The present embodiment is focused on a configuration that continuity is maintained by using the same gas condition as the flattening processing except for the processing temperature as the condition of the epitaxial layer growth of Step S4, and the gas flow fluctuation in the growth furnace 10 is suppressed as much as possible, thus the influence by the occurrence of the dust is reduced as much as possible. However, the condition of the epitaxial layer growth of Step S4 is not limited thereto exemplified in the present embodiment. When the processing temperature $T_2$ in the process of flattening processing of Step S3 and the processing temperature $T_3$ in the epitaxial layer growth process of Step S4 satisfy $T_2 > T_3$, the triangular defect can be suppressed.

As described above, the method of manufacturing the silicon carbide epitaxial wafer according to the present embodiment includes: the $H_2$ etching process of Step S2 of etching the surface of the silicon carbide substrate using the etching gas including $H_2$; the process of flattening processing of Step S3 of flattening the surface etched in the etching process of Step S2, using the gas including the $H_2$ gas, the $SiH_4$ gas which is the Si supply gas, and $C_3H_8$ gas which is the C supply gas; and the epitaxial layer growth process of Step S4 of performing the epitaxial growth on the surface flattened in the process of flattening processing of Step S3, using the gas including the $SiH_4$ gas which is the Si supply gas and the $C_3H_8$ gas which is the C supply gas. The processing temperature $T_1$ in the $H_2$ etching process of Step S2, the processing temperature $T_2$ in the process of flattening processing of Step S3, and the processing temperature $T_3$ in the epitaxial layer growth process of Step S4 satisfy $T_1 > T_2 > T_3$. $T_1 > T_2$ is satisfied, thus the latent flaw and the inclusion can be efficiently removed in the $H_2$ etching process of Step S2, and the triangular defect caused by the latent flaw and the inclusion can be suppressed. Moreover, the indent can be flattened in the process of flattening processing of Step S3, and the triangular defect caused by the indent can be suppressed. $T_2 > T_3$ is satisfied, thus the triangular defect caused by the indent and the triangular defect caused by the defect remaining after the flattening processing and the unevenness can be suppressed. As described above, the method of manufacturing the silicon carbide epitaxial wafer according the present embodiment is the method of manufacturing the silicon carbide epitaxial wafer appropriate for suppressing the occurrence of the triangular defect.

A degree of flattening the indent in the process of flattening processing of Step S3 depends on a degree of the migration of the atoms of the material gas, and the degree of the migration depends on a temperature. In the present embodiment, the Si supply gas (the first Si supply gas) and the C supply gas (the first C supply gas) used in the process of flattening processing of Step S3 and the Si supply gas (the second Si supply gas) and the C supply gas (the second C supply gas) used in the epitaxial layer growth process of Step S4 are the same Si supply gas and the C supply gas, however, different Si supply gas and C supply gas may also be used. Also in this case, $T_2 > T_3$ is satisfied, thus the degree of the migration is controlled, and the triangular defect caused by the indent, the triangular defect caused by the defect and the unevenness remaining after the flattening processing, and step bunching, for example, can be suppressed. The first Si supply gas and the second Si supply gas are the same Si supply gas, and the first C supply gas and the second C supply gas are the same C supply gas, thus the gas flow fluctuation in the growth furnace 10 at the time of proceeding the process from the process of flattening processing of Step S3 to the epitaxial layer growth process of Step S4 can be suppressed, and the occurrence of the dust in the growth furnace 10 can be suppressed.

The Si supply gas may be any of $SiH_2Cl_2$, $SiHCl_3$, and $SiCl_4$, for example. Hydrocarbon gas such as $C_2H_2$, for example, can be used other than $C_3H_8$ as the C supply gas.

A-4. Effect

The processing temperature $T_1$ in the $H_2$ etching process of Step S2, the processing temperature $T_2$ in the process of flattening processing of Step S3, and the processing temperature $T_3$ in the epitaxial layer growth process of Step S4 satisfy $T_1 > T_2 > T_3$. As described above, the method of manufacturing the silicon carbide epitaxial wafer according the present embodiment is the method of manufacturing the silicon carbide epitaxial wafer appropriate for suppressing the occurrence of the triangular defect. The first Si supply gas and the second Si supply gas are the same Si supply gas, and the first C supply gas and the second C supply gas are the same C supply gas. Accordingly, the gas flow fluctuation in the growth furnace 10 at the time of proceeding the process from the process of flattening processing of Step S3 to the epitaxial layer growth process of Step S4 can be suppressed, and the occurrence of the dust in the growth furnace 10 can be suppressed.

In the method of manufacturing the silicon carbide epitaxial wafer according to the present embodiment, the processing temperature $T_1$ in the $H_2$ etching process of Step S2 is equal to or larger than 1650° C. and equal to or smaller than 1750° C., the processing temperature $T_2$ in the process of flattening processing of Step S3 is equal to or larger than 1550° C. and equal to or smaller than 1680° C., and the processing temperature $T_3$ in the epitaxial layer growth process of Step S4 is equal to or larger than 1450° C. and equal to or smaller than 1600° C. According to this condition, the silicon carbide epitaxial wafer in which the triangular defect is suppressed more efficiently can be manufactured.

A-5. Modification Example

It is also applicable that the silicon carbide epitaxial layer 12 is formed in the processing up to the epitaxial layer growth process of Step S4, and then the other epitaxial growth is performed with an increased processing temperature to form the other epitaxial layer (referred to as a silicon carbide epitaxial layer 13) on the surface of the silicon carbide epitaxial layer 12. That is to say, it is also applicable that the silicon carbide epitaxial layer 13 is formed, or the other epitaxial growth is further performed on the silicon carbide epitaxial layer 13 to form the silicon carbide epitaxial wafer in which the plurality of epitaxial layers are formed on the silicon carbide substrate 1.

In the epitaxial layer growth process of Step S4, the epitaxial layer growth is performed at a lower temperature than a preferable temperature from a viewpoint of the growth speed, thus the defect and the unevenness remaining after flattening the indent in the process of flattening processing of Step S3 are hardly carried over to the epitaxial growth. However, the epitaxial layer growth process of Step S4 is not preferable from a viewpoint of the growth speed of the epitaxial layer, thus it is preferable from a viewpoint of productivity to increase the processing temperature after the epitaxial layer growth process of Step S4 to increase the growth speed.

That is to say, the indent is flattened in the process of flattening processing of Step S3, the defect and the unevenness remaining after flattening the indent are reduced in the epitaxial layer growth process of Step S4, and subsequently, the other epitaxial growth different from the epitaxial layer growth process of Step S4 is performed at the high growth speed, thus the silicon carbide epitaxial wafer in which the triangular defect and the unevenness are also reduced can be manufactured efficiently.

B. Comparison Example 1

In a comparison example 1, the process of flattening processing of Step S3 in the processing illustrated in the flow chart in FIG. 3 described in <A-3. Method of manufacturing silicon carbide epitaxial wafer> in the embodiment is not performed, however, Step S1, Step S2, Step S4, and Step S5 are performed in this order to manufacture the silicon carbide epitaxial wafer. The processing conditions of the $H_2$ gas etching process of Step S2 and the epitaxial layer growth process of Step S4 in the present comparison example are the same as those in the embodiment, respectively.

C. Comparison Example 2

In a comparison example 2, the processing illustrated in the flow chart in FIG. 3 described in <A-3. Method of manufacturing silicon carbide epitaxial wafer> in the embodiment is performed while changing the processing temperature in the $H_2$ gas etching process of Step S2 to 1600° C., which is the same as the temperature in the process of flattening processing of Step S3, to manufacture the silicon carbide epitaxial wafer. The other conditions such as a gas flow amount and a pressure other than the processing temperature in the conditions of the $H_2$ gas etching process of Step S2 are the same as the $H_2$ gas etching process of Step S2 in the embodiment. The processing conditions of the process of flattening processing of Step S3 and the epitaxial layer growth process of Step S4 in the present comparison example are the same as those in the embodiment, respectively.

C. Comparison Example 3

In a comparison example 2, the processing illustrated in the flow chart in FIG. 3 described in <A-3. Method of manufacturing silicon carbide epitaxial wafer> in the embodiment is performed while changing the processing temperature in the epitaxial layer growth process of Step S4 to 1600° C., which is the same as the processing temperature in the process of flattening processing of Step S3 to manufacture the silicon carbide epitaxial wafer. The other conditions such as a gas flow amount and a pressure other than the processing temperature in the conditions of the epitaxial layer growth process of Step S2 are the same as those in the embodiment. The processing conditions of the $H_2$ gas etching process of Step S2 and the process of flattening processing of Step S3 in the present comparison example are the same as those in the embodiment, respectively.

E. Evaluation Result

Each of the silicon carbide epitaxial wafers manufactured in the embodiment and the comparison examples 1 to 3 is taken out of the growth furnace 10, and the number of triangular defects on the surface of the epitaxial growth layer (a main surface of the epitaxial growth layer on a side opposite to the silicon carbide substrate 1) of the silicon carbide epitaxial wafer is evaluated using an optical surface defect evaluation device. FIG. 4 is a diagram for comparing the number of triangular defects on each surface of the epitaxial growth layer in the embodiment and the comparison example 1. The plurality of silicon carbide epitaxial wafers are manufactured, and a result of each of the plurality of silicon carbide epitaxial wafers are plotted as a point in FIG. 4 for each of the embodiment and the comparison example 1. In FIG. 4, each of an average of the number of triangular defects on the surface of the epitaxial growth layer of the plurality of silicon carbide epitaxial wafers manufactured in the embodiment and an average of the number of triangular defects on the surface of the epitaxial growth layer of the plurality of silicon carbide epitaxial wafers manufactured in the comparison example 1 is illustrated by a crossbar. In a vertical axis, the average of the number of triangular defects on the surface of the epitaxial growth layer of the plurality of silicon carbide epitaxial wafers manufactured in the embodiment is scaled to 1.

As illustrated in FIG. 4, in the embodiment, the number of triangular defects is clearly reduced by performing the flattening processing compared with that in the comparison example 1. In the embodiment, a silicon carbide epitaxial wafer having a low defect density in which a triangular defect density is equal to or smaller than 0.1 pieces/$cm^2$ is obtained.

The number of triangular defects is smaller in the embodiment than that in each of the comparison examples 2 and 3.

The processing temperature in the $H_2$ gas etching of Step 2 is 1600° C., which is the same as that in the process of flattening processing of Step S3, in the comparison example 2, and in contrast, the processing temperature in the $H_2$ gas etching of Step 2 is larger than 1600° C., which is the temperature in the process of flattening processing of Step S3, in the embodiment. Thus, it is considered that the latent flaw and the inclusion located in the surface of the silicon carbide substrate 1 can be removed more efficiently and the triangular defect caused by the latent flaw and the inclusion is reduced in the embodiment compared to the comparison example 2.

The processing temperature in the epitaxial layer growth process of Step S4 is the same as that in the process of flattening processing of Step S3 in the comparison example 3, and in contrast, the processing temperature in the epitaxial layer growth process of Step S4 is lower than that in the process of flattening processing of Step S3 in the embodiment. Thus, it is considered that in the embodiment, the other defect and unevenness remaining after flattening the indent in the process of flattening processing of Step S3 are hardly carried over in the epitaxial growth compared with the case in the comparison example 3, and the triangular defect caused by the other defect and unevenness is reduced. That is to say, the processing temperature $T_2$ in the process of flattening processing of Step S3 and the processing temperature $T_3$ in the epitaxial layer growth process of Step S4 satisfy $T_2 > T_3$, thus the triangular defect caused by the indent can be sufficiently reduced, and the triangular defect caused by a factor other than the indent can also be reduced.

FIG. 5 is a diagram expressing a tendency of an effect of reduction in a triangular defect in the process of flattening processing at a time of changing the flattening processing time and the flattening processing temperature. The effect of reduction in the triangular defect expresses a degree of reduction in the triangular defect in a case where the process of flattening processing is performed compared with a case where the process of flattening processing is not performed. However, the $H_2$ etching process and the epitaxial layer growth process are performed under the same conditions in the cases where the process of flattening processing is performed or is not performed, and $T_1 > T_2 > T_3$ is satisfied.

FIG. 5 indicates that the processing time of the flattening processing is reduced as the temperature $T_2$ in the flattening processing gets higher, and in contrast, the processing time of the flattening processing needs to be extended when the temperature in the flattening processing is low. Considered as the reason thereof is that the migration of the atoms of the material gas is active when the temperature is high. Recognized from an experimental result is that the higher effect of reduction in the triangular defect can be obtained in a processing time in which a flattening processing time $T_2$ [° C.] and a processing time t [minute] satisfy $T_2 \geq -34.1$ ln(t)+1687. A temperature $T_2$, which is out of range of the flattening processing temperature equal to or larger than 1550° C. and equal to or smaller than 1680° C. which is preferable in <A-3-2. Process of flattening processing>, also has the processing time t satisfying $T_2 \geq -34.1$ ln(t)+1687. However, as described in <A-3-2. Process of flattening processing>, it is more preferable that $T_2$ is equal to or larger than 1550° C. and equal to or smaller than 1680° C.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a silicon carbide epitaxial wafer, comprising:
    etching a surface of a silicon carbide substrate at a first temperature using etching gas including $H_2$;
    flattening the surface etched by the etching, at a second temperature using gas including $H_2$ gas, first Si supply gas, and first C supply gas; and
    performing an epitaxial growth on the surface flattened by the flattening, at a third temperature using gas including second Si supply gas and second C supply gas, wherein
    the first temperature $T_1$, the second temperature $T_2$, and the third temperature $T_3$ satisfy $T_1 > T_2 > T_3$.

2. The method of manufacturing the silicon carbide epitaxial wafer according to claim 1, wherein
    the first Si supply gas and the second Si supply gas are identical Si supply gas, and
    the first C supply gas and the second C supply gas are identical C supply gas.

3. The method of manufacturing the silicon carbide epitaxial wafer according to claim 2, wherein
    the first Si supply gas is $SiH_4$ gas, and
    the first C supply gas $C_3H_8$ gas.

4. The method of manufacturing the silicon carbide epitaxial wafer according to claim 1, wherein
    the first temperature $T_1$ is equal to or larger than 1650° C. and equal to or smaller than 1750° C., the second temperature $T_2$ is equal to or larger than 1550° C. and equal to or smaller than 1680° C., and the third temperature $T_3$ is equal to or larger than 1450° C. and equal to or smaller than 1600° C.

5. The method of manufacturing the silicon carbide epitaxial wafer according to claim 1, wherein
    the second temperature $T_2$ and a processing time t of the flattening satisfy $T_2 \geq -34.1$ ln(t)+1687.

6. The method of manufacturing the silicon carbide epitaxial wafer according to claim 4, wherein
    the second temperature $T_2$ and a processing time t of the flattening satisfy $T_2 \geq -34.1$ ln(t)+1687.

7. The method of manufacturing the silicon carbide epitaxial wafer according to claim 1, wherein
    a silicon carbide epitaxial wafer having a triangular defect density equal to or smaller than 0.1 pieces/cm² is manufactured.

8. The method of manufacturing the silicon carbide epitaxial wafer according to claim 1, wherein
    an indent is formed by the etching at a location of a latent flaw or an inclusion included in the silicon carbide substrate before the etching, and
    in the flattening, the indent is flattened.

* * * * *